(12) United States Patent
Tsai et al.

(10) Patent No.: US 12,114,510 B2
(45) Date of Patent: Oct. 8, 2024

(54) SOT MRAM HAVING DIELECTRIC INTERFACIAL LAYER AND METHOD FORMING SAME

(71) Applicant: Taiwan Semiconductor Manufacturing Co., Ltd., Hsinchu (TW)

(72) Inventors: Wilman Tsai, Saratoga, CA (US); MingYuan Song, Hsinchu (TW); Shy-Jay Lin, Jhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 97 days.

(21) Appl. No.: 17/809,928

(22) Filed: Jun. 30, 2022

(65) Prior Publication Data

US 2022/0328559 A1 Oct. 13, 2022

Related U.S. Application Data

(62) Division of application No. 16/806,203, filed on Mar. 2, 2020, now Pat. No. 11,469,267.

(60) Provisional application No. 62/849,322, filed on May 17, 2019.

(51) Int. Cl.
*H10B 61/00* (2023.01)
*G11C 11/16* (2006.01)
*H10N 50/01* (2023.01)
*H10N 50/80* (2023.01)

(52) U.S. Cl.
CPC ............ *H10B 61/00* (2023.02); *G11C 11/161* (2013.01); *H10N 50/01* (2023.02); *H10N 50/80* (2023.02)

(58) Field of Classification Search
CPC ...... H10B 61/00; G11C 11/161; H10N 50/01; H10N 50/80; H01F 10/329
See application file for complete search history.

(56) References Cited

U.S. PATENT DOCUMENTS

| 8,753,899 | B2 | 6/2014 | Tang |
| 9,076,537 | B2 | 7/2015 | Khvalkovskiy et al. |
| 9,935,258 | B2 | 4/2018 | Chen |
| 10,096,770 | B2 | 10/2018 | Shimizu et al. |

(Continued)

FOREIGN PATENT DOCUMENTS

| CN | 102956815 A | 3/2013 |
| CN | 103633239 A | 3/2014 |

(Continued)

OTHER PUBLICATIONS

Cubukcu, et al., "Ultra-Fast Perpendicular Spin-Orbit Torque MRAM," IEEE Transactions on Magnetics, vol. 54, No. 4, Apr. 2018, 4 pages.

(Continued)

*Primary Examiner* — Shih Tsun A Chou
(74) *Attorney, Agent, or Firm* — Slater Matsil, LLP

(57) ABSTRACT

A device includes a spin orbit coupling layer and a Magnetic Tunnel Junction (MTJ) stack. The MTJ stack includes a dielectric layer over the spin orbit coupling layer, a free layer over the dielectric layer, a tunnel barrier layer over the free layer, and a reference layer over the tunnel barrier layer. The spin orbit coupling layer extends beyond edges of the MTJ stack in a first direction and a second direction opposite to the first direction.

20 Claims, 14 Drawing Sheets

(56) References Cited

U.S. PATENT DOCUMENTS

| | | | |
|---|---|---|---|
| 10,319,901 B2 | 6/2019 | Sasaki | |
| 10,381,060 B2 | 8/2019 | Kan | |
| 2011/0235217 A1 | 9/2011 | Chen | |
| 2013/0032908 A1* | 2/2013 | Tang | H10N 50/10 |
| | | | 257/E29.323 |
| 2013/0175644 A1 | 7/2013 | Horng | |
| 2014/0056060 A1* | 2/2014 | Khvalkovskiy | G11C 11/1675 |
| | | | 365/158 |
| 2017/0077177 A1 | 3/2017 | Shimomura et al. | |
| 2018/0123021 A1* | 5/2018 | Sasaki | H10N 50/85 |
| 2018/0145247 A1 | 5/2018 | Saito et al. | |
| 2018/0166197 A1* | 6/2018 | Wang | H10N 52/00 |
| 2018/0219152 A1 | 8/2018 | Apalkov et al. | |
| 2018/0375016 A1 | 12/2018 | Shimizu et al. | |
| 2020/0006626 A1 | 1/2020 | Smith et al. | |
| 2020/0006630 A1* | 1/2020 | Sato | H10N 50/80 |
| 2020/0227474 A1 | 7/2020 | O'Brien et al. | |

FOREIGN PATENT DOCUMENTS

| | | |
|---|---|---|
| CN | 103907156 A | 7/2014 |
| CN | 108011037 A | 5/2018 |
| CN | 109643567 A | 4/2019 |
| EP | 2851903 A1 | 9/2013 |
| JP | 2018022805 A | 2/2018 |
| KR | 20140027036 A | 3/2014 |
| WO | 2019005156 A1 | 1/2019 |

OTHER PUBLICATIONS

Gurram, et al., "Elecrical spin injection, transport, and detection in graphene-hexagonal boron nitried van der Waals heterostructures: porgress and perspectives," 2D Materials. Jun. 1, 2018, 21 pages.

Lee, et al., "Spin-orbit-torque and magnetic damping in tailored ferromagnetic bilayers," Physical Review Applied, vol. 10, Issue 2, Aug. 21, 2018, 26 pages.

Luango, J. P., "Infrared Characterization of a- and B-Crystalline Silicon Nitride," Journal of Electrochem Society, vol. 130, No. 7, Jul. 1983, pp. 1560-1562.

Pai, et al., "Determination of spin torque efficiencies in heterostructures with perpendicular magnetic anisotropy," American Physical Society, Physical Review, Apr. 8, 2016, pp. 144409-1-144409-7.

Pai, et al., "Enhancement of perpendicular magnetic anisotropy and transmission of spin-Hall-effect-induced spin currents by a Hf spacer layer in W/Hf/CoFeB/MgO layer structures," Applied Physics Letter, vol. 104, Feb. 26, 2014, 6 pages.

Putkonen, et al., "Surface-controlled growth of magnesium oxide thin films by atomic layer epitaxy," Journal of Chemistry Matericals, vol. 9, Jul. 13, 1999, pp. 2449-2452.

Shi, et al., "Fast Low-Current Spin-Orbit-Torque Switching of Magnetic Tunnel Junctions through Atomic Modifications of the Free-Layer Interfaces," American Physical Society, Physical Review Applied, vol. 9, Jan. 30, 2018, pp. 011002-1-011002-6.

Wang, et al., "Low-power non-volatile spintronic memory: STT-RAM and beyond," Journal of Physics D: Applied Physics, vol. 46, Jan. 31, 2013, 11 pages.

* cited by examiner

SOT MRAM HAVING DIELECTRIC INTERFACIAL LAYER AND METHOD FORMING SAME

PRIORITY CLAIM AND CROSS-REFERENCE

This application is a divisional of U.S. patent application Ser. No. 16/806,203, entitled "SOT MRAM Having Dielectric Interfacial Layer and Method Forming Same," and filed Mar. 2, 2020, which claims the benefit of the U.S. Provisional Application No. 62/849,322, entitled "SOT MRAM Having Dielectric Interfacial Layer and Method Forming Same," and filed May 17, 2019, which applications are hereby incorporated herein by reference.

BACKGROUND

Semiconductor memories are used in integrated circuits for electronic applications, including cell phones and personal computing devices, as examples. One type of semiconductor memory device is Magneto-Resistive Random Access Memory (MRAM), which involves spin electronics that combines semiconductor technology and magnetic materials and devices. The spins of electrons, through their magnetic moments, rather than the charge of the electrons, are used to store bit values.

Conventional MRAM cells are Spin-Transfer Torque (STT) MRAM cells. A typical STT MRAM cell may include a Magnetic Tunnel Junction (MTJ) stack, which includes a pinning layer, a pinned layer over the pinning layer, a tunnel layer over the pinned layer, and a free layer over the tunnel layer. During the formation of the MRAM cell, a plurality of blanket layers are deposited first. The blanket layers are then patterned through a photo etching process to form the MTJ stack. A dielectric capping layer is then formed to protect the MTJ stack. The dielectric capping layer includes some portions on the sidewalls, and possibly additional portions over the top surface, of the MTJ stack.

The STT MRAM cells suffer from reliability problem due to the fact that programming currents have to pass through the tunnel layer, hence degrade or damage the tunnel layer. Accordingly, Spin Orbit Torque (SOT) MRAM was developed. In the programming of the SOT MRAM cells, the programming current does not pass through the tunnel layer, hence the reliability of the SOT MRAM is improved over the STT MRAM.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
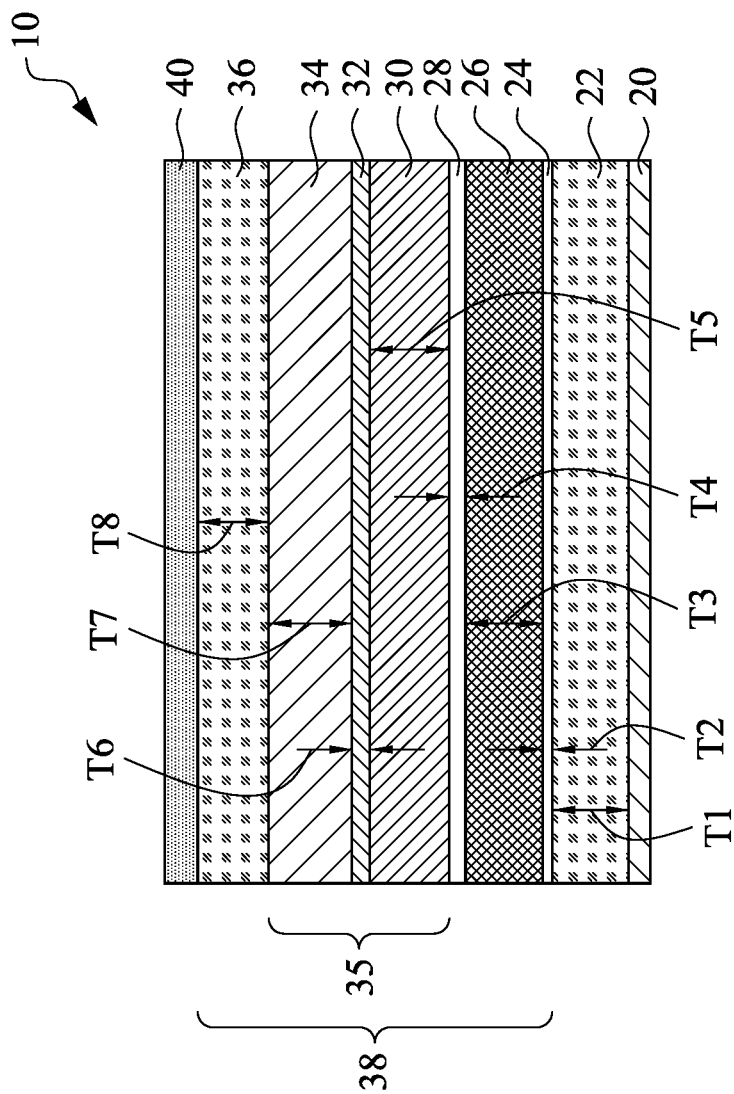
FIGS. 1 through 10 illustrate the cross-sectional views and a top view of intermediate stages in the formation of a Spin Orbit Torque (SOT) Magneto-Resistive Random Access Memory (MRAM) cell in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Spin Orbit Torque (SOT) Magneto-Resistive Random Access Memory (MRAM) cell and the method of forming the same are provided in accordance with various embodiments. The intermediate stages in the formation of the SOT MRAM cell are illustrated in accordance with some embodiments. Some variations of some embodiments are discussed. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

In accordance with some embodiments of the present disclosure, an SOT MRAM cell includes a spin orbit coupling layer and a free layer, and a dielectric interfacial layer inserted between the spin orbit coupling layer and the free layer. The dielectric interfacial layer has the effect of improving the spin polarization efficiency, and the spin polarized current may be increased. Accordingly, the programming current flowing through the spin orbit coupling layer may be reduced without sacrificing the spin polarized current.

Figure 16:
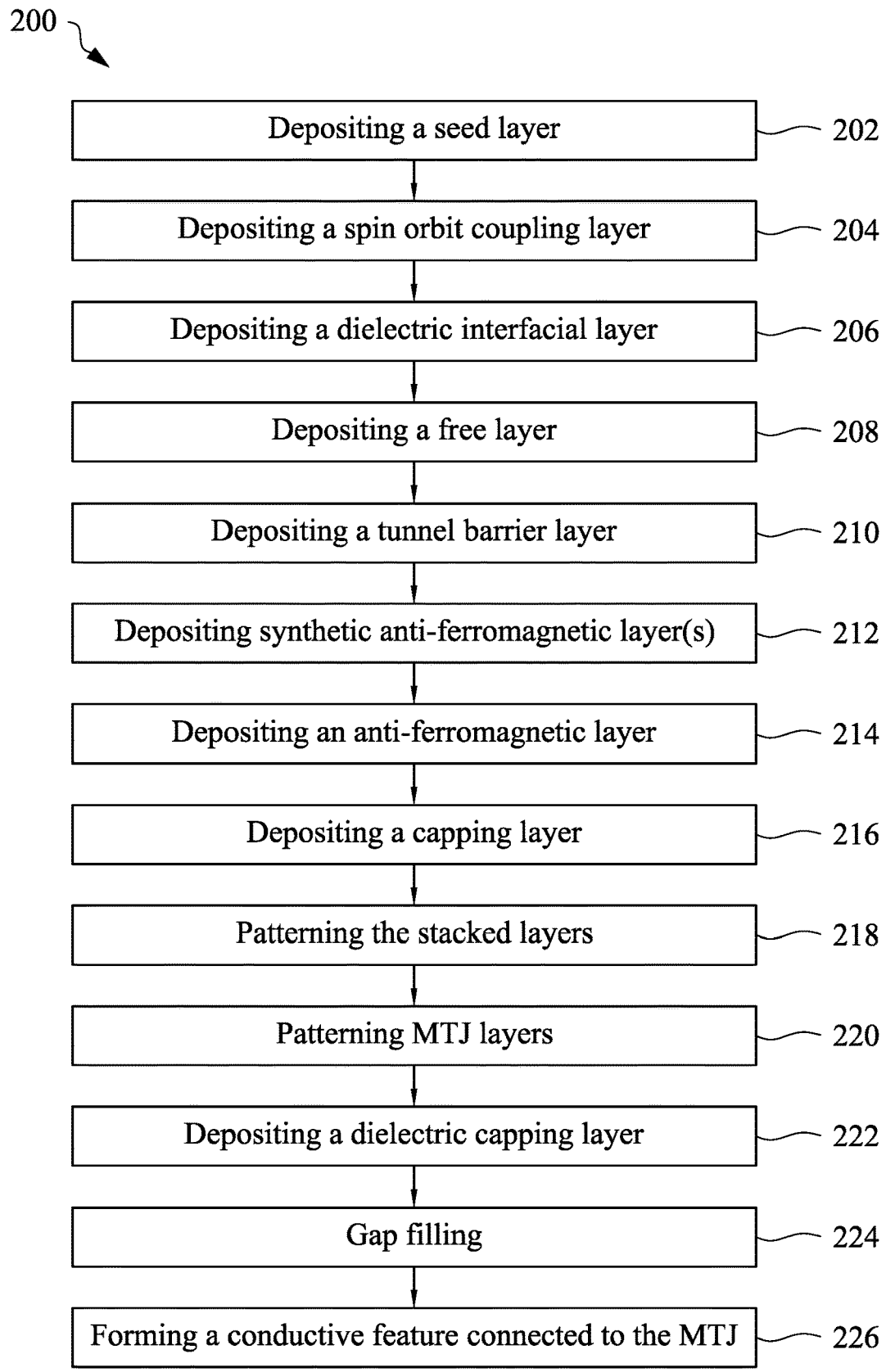
FIG. 16 illustrates a process flow for forming a SOT MRAM cell in accordance with some embodiments.

FIGS. 1 through 10 illustrate the cross-sectional views and a top view of intermediate stages in the formation of an SOT MRAM cell in accordance with some embodiments of the present disclosure. The corresponding processes are also reflected schematically in the process flow 200 shown in FIG. 16.

Referring to FIG. 1, a plurality of stacked layers are formed. In accordance with some embodiments of the present disclosure, the plurality of stacked layers are formed in a semiconductor wafer 10, which may be formed based on a semiconductor substrate, such as a silicon substrate. Integrated circuits (not shown), which may include active devices such as transistors and diodes and passive devices such as resistors, capacitors, inductors, or the like may be formed on the semiconductor substrate. The circuits for operating the SOT MRAM cell, which may include a current source, a voltage source, a selector (for selecting the SOT MRAM cell for operating), or the like, may be formed on the semiconductor substrate.

In accordance with some embodiments, the illustrated plurality of layers may be formed in an interconnect structure of the wafer (and the corresponding device die). For example, the plurality of stacked layers may be formed in an Inter-Metal Dielectric (IMD) layer, which may be formed of a low-k dielectric material. The IMD layers are used for forming metal lines and vias used for interconnecting the integrated circuit devices in the device die.

In accordance with some embodiments of the present disclosure, seed layer 20 is formed. The respective process is illustrated as process 202 in the process flow 200 shown in FIG. 16. Seed layer 20 may be formed of a material that has a good crystalline structure, and may be formed of a dielectric layer such as MgO, for example. The crystalline structure of seed layer 20 has the effect of improving the property of the overlying spin orbit coupling layer 22. The formation method of seed layer 20 may include Physical Vapor Deposition (PVD), for example.

Spin orbit coupling layer 22 is first formed through deposition. The respective process is illustrated as process 204 in the process flow 200 shown in FIG. 16. Spin orbit coupling layer 22 acts as the generator of spin polarized current. By conducting a current flowing through spin orbit coupling layer 22, spin orbit coupling layer 22 generates spin polarized currents in transverse directions, which spin polarized currents are used to program the overlying free layer. In accordance with some embodiments of the present disclosure, spin orbit coupling layer 22 is formed of a heavy metal or a metal alloy, which may be selected from W, Ta, Pt, AuPt, $W_3Ta$, $Bi_xSe_y$, BiSeTe, multi-layers thereof, and/or alloys thereof. The thickness T1 of spin orbit coupling layer 22 may be in the range between about 1 nm and about 10 nm. In accordance with some embodiments, the formation of spin orbit coupling layer 22 is performed through PVD, and other applicable methods (depending on the material) such as plating, Chemical Vapor Deposition (CVD), or the like, may be used.

Dielectric interfacial layer 24 is formed over and contacting spin orbit coupling layer 22. The respective process is illustrated as process 206 in the process flow 200 shown in FIG. 16. In accordance with some embodiments, dielectric interfacial layer 24 is formed of a dielectric material such as a nitride, an oxide, alloys thereof, multi-layers thereof, or the like. For example, the oxide may include, and is not limited to, MgO, $HfO_x$, $AlO_x$, $AgO_x$, CuO, SrO, or the combinations thereof. The nitride may include, and is not limited to, HfN, AlN, AgN, SrN, or alloys thereof. The dielectric material may also be the combination of the aforementioned nitride and oxide.

It is appreciated that spin polarized current generated in the subsequently patterned spin orbit coupling layer 22 will flow into the overlying free layer 26 to modify the spin polarization direction of the overlying free layer 26. The thickness T2 of dielectric interfacial layer 24 is thus small enough to allow the effective tunneling of the spin polarized current (and carriers such as electrons) to flow through it. In accordance with some embodiments of the present disclosure, the thickness T2 is smaller than about 10 Å, and may be in the range between about 1 Å and about 5 Å. Experiment results indicated that with the increase in the thickness T2 (for example, greater than about 5 Å), the benefit of having the dielectric interfacial layer 24 starts to reduce, and further increasing the thickness of dielectric interfacial layer 24, the benefit may be fully eliminated, and may also cause the failure of the resulting SOT MRAM cell, for example, when thickness T2 is greater than about 10 Å or 15 Å (depending on the programming current). Dielectric interfacial layer 24 may be formed using Atomic Layer Deposition (ALD), CVD, or the like.

Figure 10:
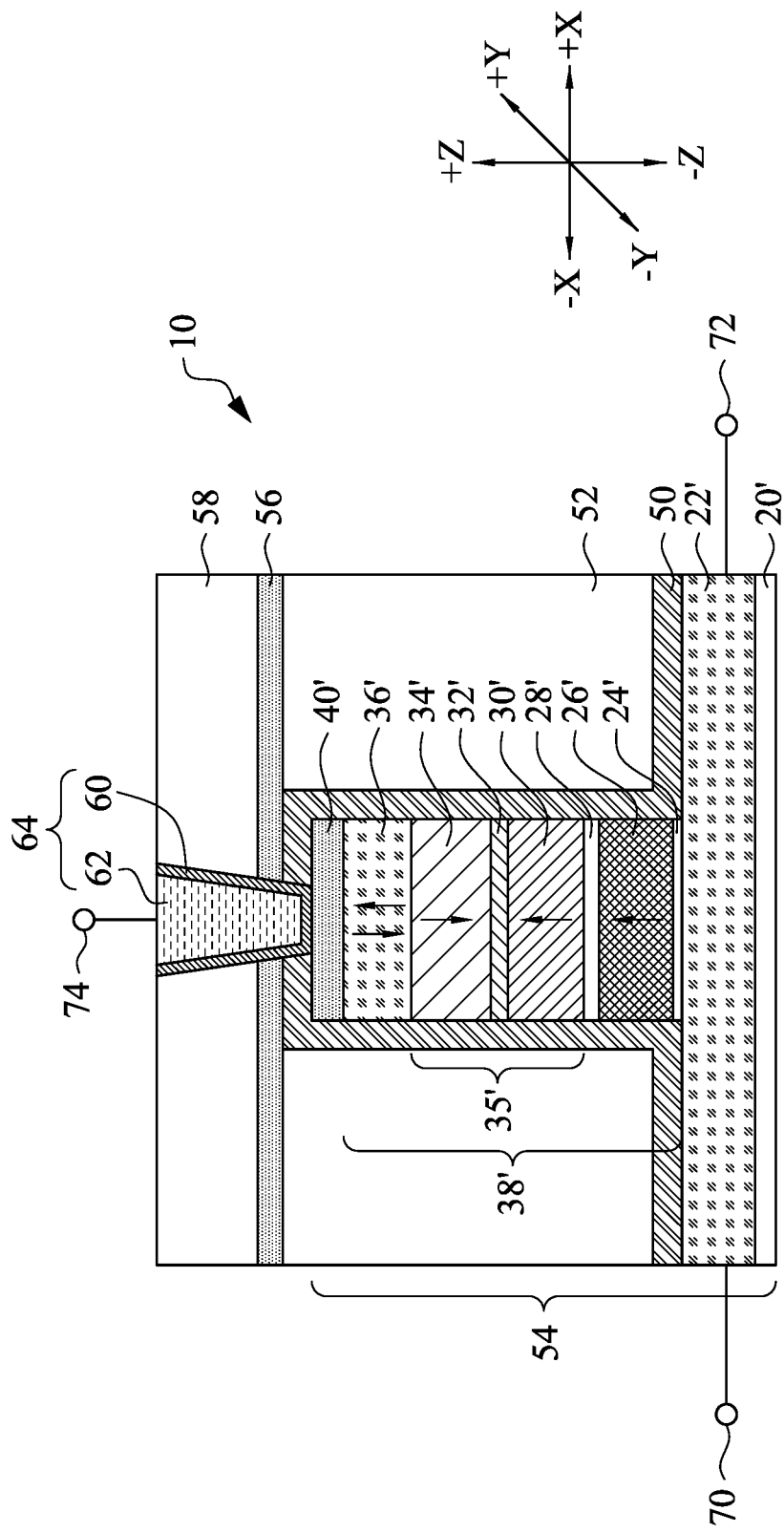

Free layer 26 is deposited over dielectric interfacial layer 24 as a state-keeping layer, and its state determines the state of the resulting SOT MRAM cell. The respective process is illustrated as process 208 in the process flow 200 shown in FIG. 16. Free layer 26 may be formed of a ferromagnetic material, which may be formed of or comprises CoFe, NiFe, CoFeB, CoFeBW, alloys thereof, or the like. Free layer 26 may be formed using a deposition method such as PVD, CVD, or the like. In accordance with some embodiments, the resulting SOT MRAM cell is a perpendicular SOT MRAM cell (as shown in FIG. 10), whose spin polarization directions are perpendicular to the major surfaces (the plane) of the free layer 26 and the overlying reference layer 30. Thickness T3 of the free layer 26 of the perpendicular SOT MRAM cell is smaller than about 1.2 nm, and may be in the range between about 0.4 nm and about 1.2 nm for generating the perpendicular spin polarization direction.

Figure 11:
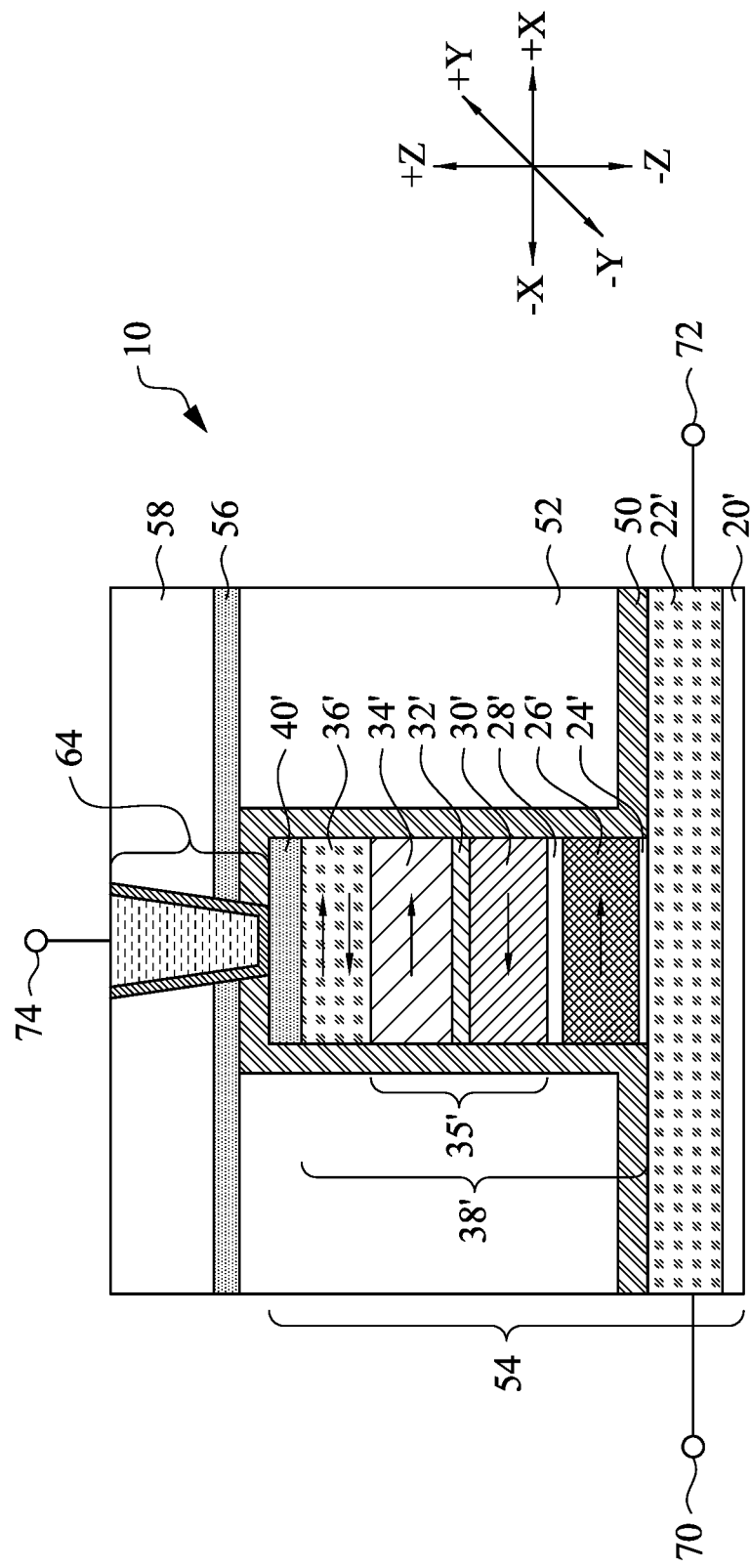
FIG. 11 illustrates the cross-sectional view of an in-plane SOT MRAM cell in accordance with some embodiments.

In accordance with other embodiments of the present disclosure, the resulting SOT MRAM cell is an in-plane SOT MRAM cell (as shown in FIG. 11), whose spin polarization directions are parallel to the major surfaces (the plane) of the free layer 26 and the overlying reference layer 30. Correspondingly, the thickness T3 of free layer 26 is greater than about 1.2 nm, and may be in the range between about 1.2 nm and about 3.0 nm for generating the in-plane spin polarization.

Over free layer 26, tunnel barrier layer 28 is deposited. The respective process is illustrated as process 210 in the process flow 200 shown in FIG. 16. In accordance with some embodiments of the present disclosure, tunnel barrier layer 28 is formed of a dielectric material such as MgO, AlO, AlN, or the like. The thickness T4 of tunnel barrier layer 28 may be in the range between about 0.1 nm and about 1.5 nm. The formation method of tunnel barrier layer 28 includes CVD, PVD, ALD, or the like.

Synthetic Anti-Ferromagnetic (SAF) layer 35 is then deposited over tunnel barrier layer 28. The respective process is illustrated as process 212 in the process flow 200 shown in FIG. 16. In accordance with some embodiments of the present disclosure, SAF layer 35 includes reference layer 30, coupling layer 32 over reference layer 30, and hard layer 34 over coupling layer 32.

In accordance with some embodiments of the present disclosure, reference layer 30 is formed of a ferromagnetic material, which may be formed of or comprise CoFe, NiFe, CoFeB, CoFeBW, alloys thereof, or the like. The thickness T5 of reference layer 30 may be greater than about 0.5 nm, and may be in the range between about 0.5 nm and about 3 nm. The formation method of reference layer 30 may include a deposition method such as PVD, CVD, or the like.

Coupling layer 32 is deposited over reference layer 30. In accordance with some embodiments of the present disclosure, coupling layer 32 is formed of Cu, Ru, Ir, Pt, W, Ta, Mg, alloys thereof, or the like. The thickness T6 of coupling layer 32 may be in the range between about 0.2 nm and about 2 nm. The formation method of coupling layer 32 includes PVD, CVD, or the like.

Hard layer 34 is deposited over coupling layer 32. In accordance with some embodiments of the present disclosure, hard layer 34 is formed of or comprises a ferromagnetic material such as CoFe, NiFe, CoFeB, CoFeBW, alloys thereof, or the like. The thickness T7 of hard layer 34 may be in the range between about 0.5 nm and about 3 nm. The formation method of hard layer 34 includes PVD, CVD, or the like.

SAF layer 35 may have the tri-layer structure include three layers 30, 32, and 34, as shown in FIG. 1 in accordance with some embodiments. In accordance with alternative embodiments, SAF layer 35 may be formed of or comprises a plurality of ferromagnetic metal layers separated by a plurality of non-magnetic spacer layers. The magnetic metal layers may be formed of Co, Fe, Ni, or the like, which may be in the form of CoFe, NiFe, CoFeB, CoFeBW, alloys thereof, or the like. The non-magnetic spacer layers may be formed of Cu, Ru, Ir, Pt, W, Ta, Mg, or the like. For example, the Magnetic layers may have a Co layer and repeated $(Pt/Co)_x$ layers over the Co layer, with x representing repeating number and may be any integer equal to or greater than 1.

Anti-ferromagnetic layer 36 is formed over SAF layer 35 in accordance with some embodiments. The respective process is illustrated as process 214 in the process flow 200 shown in FIG. 16. In accordance with some embodiments of the present disclosure, anti-ferromagnetic layer 36 is formed of PtMn, IrMn, RhMn, NiMn, PdPtMn, FeMn, Os, Mn, or the like. Thickness T8 of anti-ferromagnetic layer 36 may be in the range between about 1 nm and about 5 nm. The formation method of anti-ferromagnetic layer 36 includes PVD, CVD, or the like. Anti-ferromagnetic layer 36 is used to pin the spin polarization direction of reference layer 30 to a fix direction. This ensures the normal function of the resulting MTJ. With the spin polarization direction of the reference layer 30 being fixed, the low-resistance state and high-resistance state of the respective SOT MRAM cell may be manipulated by changing the spin polarization direction of free layer 26. Throughout the description of the present disclosure, layers 24, 26, 28, 30, 32, 34, and 36 are collectively referred to as Magnetic Tunnel Junction (MTJ) stack 38.

Over MTJ stack 38, capping layer 40 is deposited. The respective process is illustrated as process 216 in the process flow 200 shown in FIG. 16. In accordance with some embodiments of the present disclosure, capping layer 40 is formed of a conductive material such as W, Ti, TiN, Ta, TaN, Ru, Zr, combinations thereof, and multi-layers thereof. Capping layer 40 also acts as the top electrode of the subsequently formed MTJ (after the subsequent patterning processes).

Figure 2:
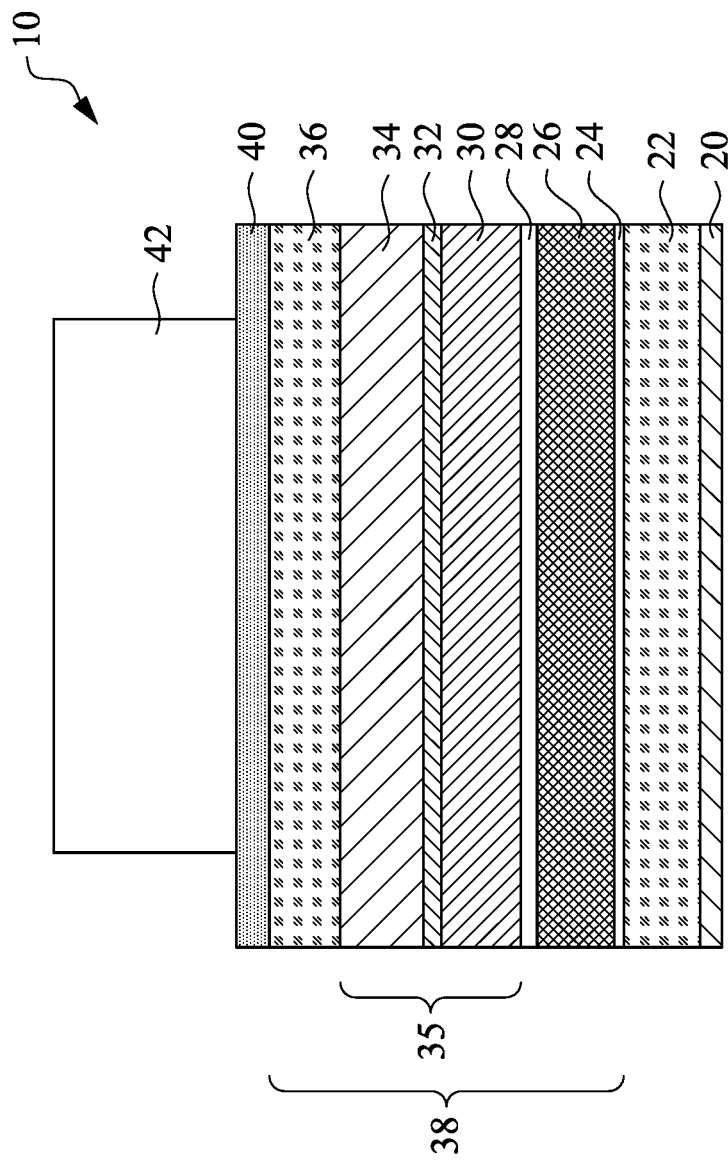

Referring to FIG. 2, etching mask 42 is formed and patterned. In accordance with some embodiments of the present disclosure, etching mask 42 includes a patterned photo resist. In accordance with other embodiments of the present disclosure, etching mask 42 includes a hard mask and a photo resist over the hard mask. The photo resist may be used to pattern the hard mask, and the hard mask may be used to pattern the underlying layers. For example, the hard mask may be formed of TiN, TaN or like materials.

Figure 3:
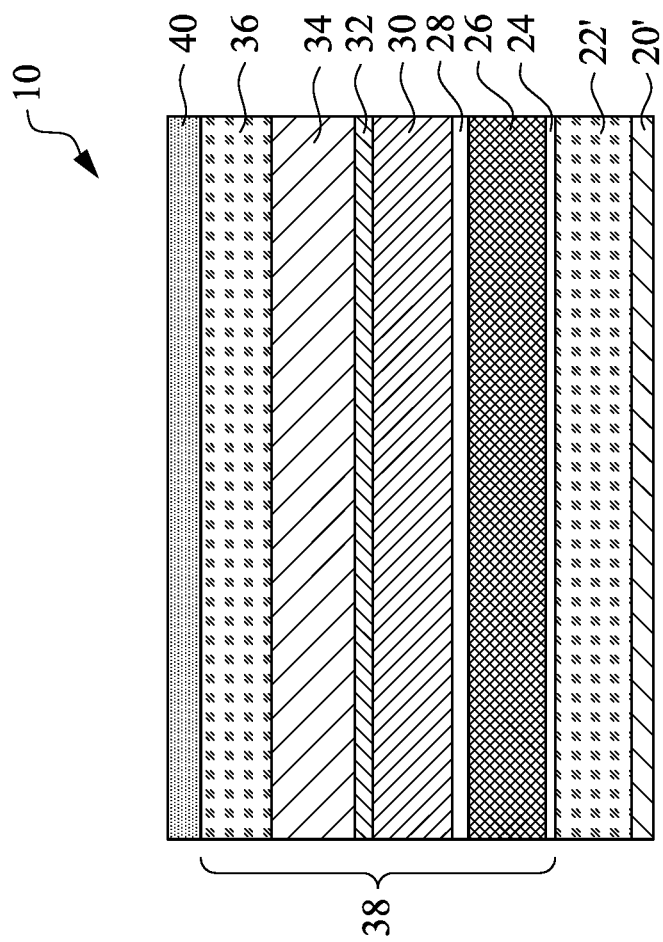

The underlying capping layer 40, MTJ stack 38, spin orbit coupling layer 22 are then patterned in an anisotropic patterning process(es). The respective process is illustrated as process 218 in the process flow 200 shown in FIG. 16. The resulting structure is shown in FIG. 3. The etching method may include a plasma etching method, which may include reactive Ion Beam Etching (IBE). The etching may be implemented using Glow Discharge Plasma (GDP), Capacitive Coupled Plasma (CCP), Inductively Coupled Plasma (ICP), or the like.

The etching gases may be selected from $Cl_2$, $N_2$, $CH_4$, He, $CH_xF_y$, $SF_6$, $NF_3$, $BCl_3$, $O_2$, Ar, $C_xF_y$, HBr, or the combinations thereof, and appropriate gases for etching a specific layer is selected according to the material of the layer. $N_2$, Ar and/or He may be used as carrier gases. For example, for etching titanium, titanium nitride, tantalum, tantalum nitride, or the like, $Cl_2$ may be used, along with other gases such as the carrier gas. For etching tungsten, $CH_xF_y$ may be used, along with other gases such as the carrier gas. Since the etched layers include a plurality of layers formed of different materials, a plurality of etching gases may be selected according to the sequence of the etching of the etched layers. With each of the selected etching gases used, one or more layers may be etched, and then the etching gas is changed, and/or the etching recipe is adjusted to etch the subsequently exposed underlying layer. In accordance with some embodiments, the etching is continued until the seed layer 20 is etched-through. The etching may also stop on seed layer 20, with seed layer 20 not patterned. In subsequent paragraphs, the remaining portions of seed layer 20 (if patterned) and spin orbit coupling layer 22 are referred to as seed layer 20' and spin orbit coupling layer 22', respectively. After the etching process, etching mask 42 (FIG. 2) is removed.

Figure 4:
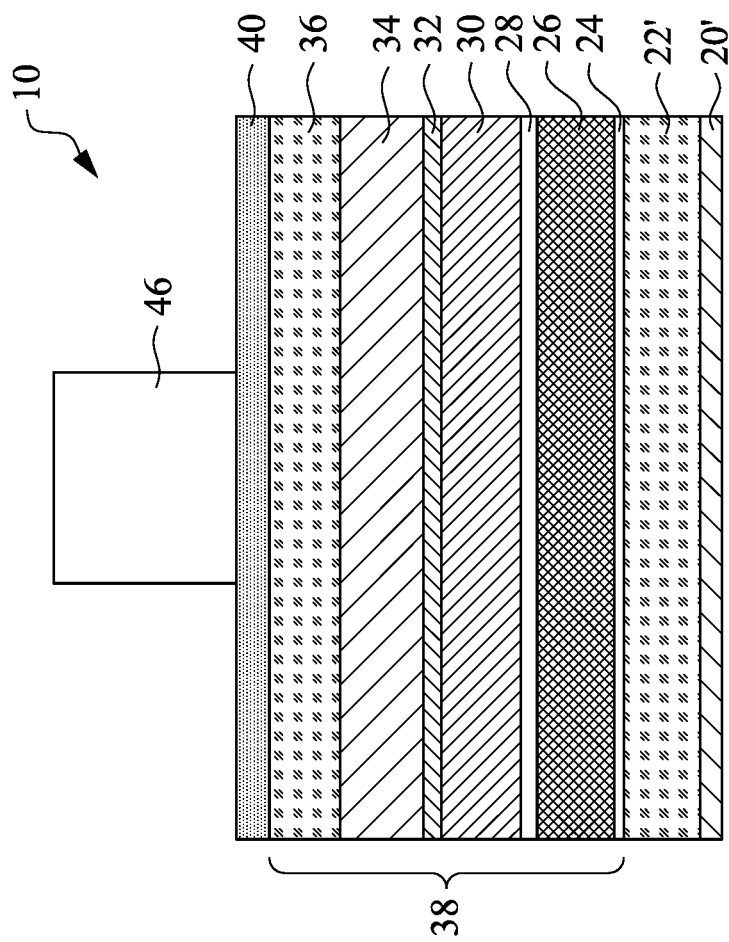

FIG. 4 illustrates the formation of the patterned etching mask 46. The patterned etching mask 46 may be formed using a material(s) selected from the same group of candidate materials for forming etching mask 42 (FIG. 2). For example, the patterned etching mask 46 may include a patterned photo resist, and may or may not include a hard mask underlying the patterned photo resist.

Figure 6:
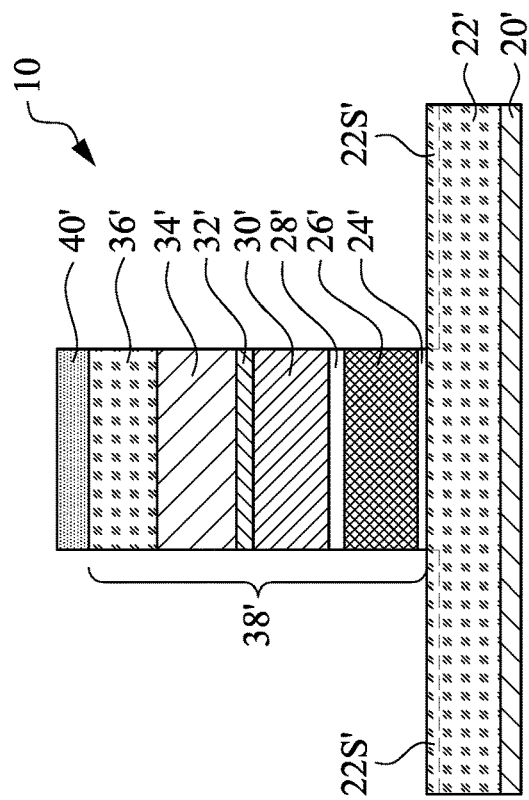
Figure 5:
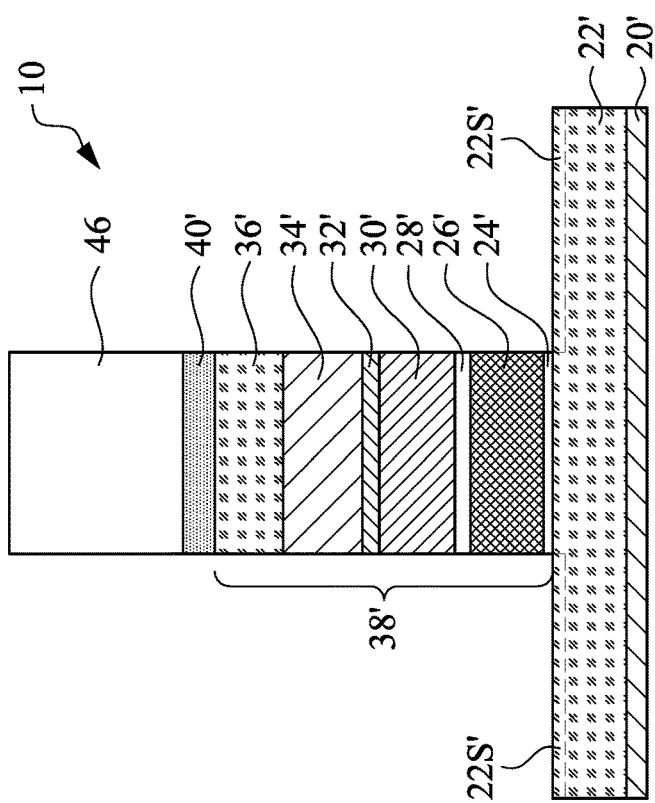

The patterned etching mask 46 is used as an etching mask to etch the underlying layers 24, 26, 28, 30, 32, 34, 36, and 40. The respective process is illustrated as process 220 in the process flow 200 shown in FIG. 16. The etching stops on spin orbit coupling layer 22', while dielectric interfacial layer 24 is etched-through. The etching gases may be selected from $Cl_2$, $N_2$, $CH_4$, He, $CH_xF_y$, $SF_6$, $NF_3$, $BCl_3$, $O_2$, Ar, $C_xF_y$, HBr, or the combinations thereof, and appropriate gases for etching a specific layer is selected according to the material of the layer. Carrier gases such as $N_2$, Ar and/or He may also be added. As shown in FIG. 5, the remaining portions of layers 24, 26, 28, 30, 32, 34, and 36 are hereinafter referred to as 24', 26', 28', 30', 32', 34', and 36', respectively, and are collectively referred to as MTJ (stack) 38'. The remaining portion of capping layer 40 is also referred to as top electrode 40' hereinafter. After the etching process, etching mask 46 is removed. The resulting structure is shown in FIG. 6. It is appreciated that although one spin orbit coupling layer 22 and one MTJ 38' are illustrated as one SOT MRAM cell, there may be a plurality of SOT MRAM cells formed simultaneously, which may form an array, for example.

It is appreciated that over-etching may occur, and a top surface portion of spin orbit coupling layer 22 may be etched. Dashed lines 22S' in FIGS. 5 and 6 schematically illustrate the positions of the top surfaces of spin orbit coupling layer 22 due to the over-etching. As a result, a top portion of spin orbit coupling layer 22 has sidewalls flush with the corresponding sidewalls of the overlying dielectric interfacial layer 24'.

Figure 7:
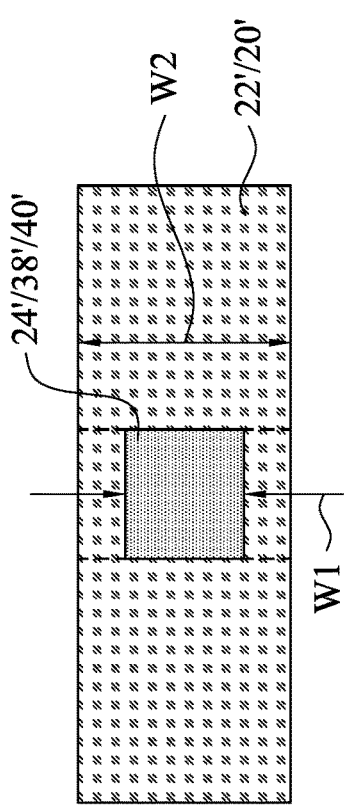

FIG. 7 illustrates a plane view (top view) of the structure shown in FIG. 6. As shown in FIGS. 6 and 7, spin orbit coupling layer 22' may be formed as an elongated strip. MTJ 38' (including dielectric interfacial layer 24') and top electrode 40' overlap a portion of spin orbit coupling layer 22'. In accordance with some embodiments of the present disclosure, the width W1 of MTJ 38' is smaller than the corresponding width W2 of spin orbit coupling layer 22'. In accordance with alternative embodiments, the width W1 of MTJ 38' is equal to the corresponding width W2 of spin orbit coupling layer 22'. Accordingly, two edges (the illustrated upper edge and lower edge) of MTJ 38' and dielectric interfacial layer 24' will be flush with the corresponding two edges of spin orbit coupling layer 22', and the corresponding MTJ 38' is shown with using dashed lines.

Figure 8:
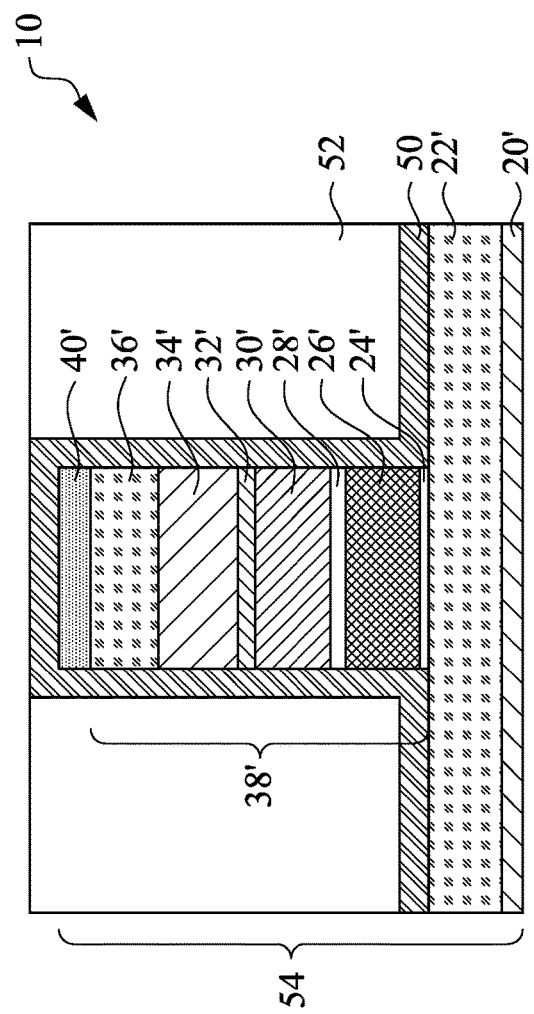

FIG. 8 illustrates the formation of dielectric capping layer 50 in accordance with some embodiments. The respective process is illustrated as process 222 in the process flow 200 shown in FIG. 16. In accordance with some embodiments of the present disclosure, dielectric capping layer 50 is formed of silicon nitride, silicon oxynitride, or the like. The formation process may be a CVD process, an ALD process, a Plasma Enhance CVD (PECVD) process, or the like. Dielectric capping layer 50 may be formed as a conformal layer.

Next, a gap-filling process is performed, in which dielectric material 52 is filled into the gaps between MTJs 38' (with one MTJ 38' illustrated). The respective process is illustrated as process 224 in the process flow 200 shown in FIG. 16. Dielectric material 52 may be formed of or comprise silicon oxide, Phospho-Silicate Glass (PSG), Boro-Silicate Glass (BSG), Boron-Doped Phospho-Silicate Glass (BPSG), Undoped Silicate Glass (USG), Fluorosilicate Glass (FSG), SiOCH, flowable oxide, porous oxide, or the like, or combinations thereof. Dielectric material 52 may also be formed of a low-k dielectric material. The formation method may include CVD, PECVD, ALD, Flowable CVD (FCVD), spin-on coating, or the like. After the gap-filling process, a planarization process such as a Chemical Mechanical Polish (CMP) process or a mechanical grinding process may be performed. The planarization process may be performed using dielectric capping layer 50 or top electrodes 40' as a CMP stop layer. Accordingly, the top surface of dielectric material 52 may be level with the top surface of dielectric capping layer 50 or the top surface of top electrode 40'. MRAM cell 54 is thus formed.

Figure 9:
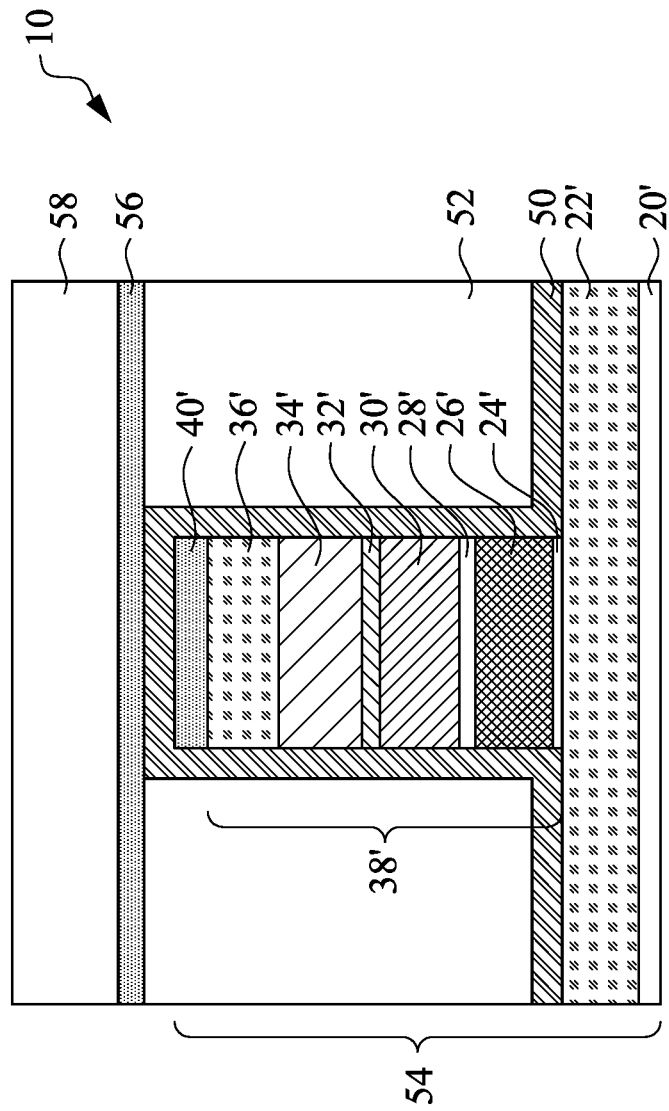

Referring to FIG. 9, etch stop layer 56 and dielectric layer 58 are deposited. In accordance with some embodiments, etch stop layer 56 is formed of silicon oxide, silicon nitride, silicon carbide, silicon oxynitride, silicon oxy carbo-nitride, or the like. Dielectric layer 58 may be (or may not be) formed of a dielectric material selected from the same (or different) group of candidate materials for forming dielectric material 52.

FIG. 10 illustrates the structure after the formation of conductive feature 64, which may be vias, conductive lines (which may be word lines or bit lines), or the like. The respective process is illustrated as process 226 in the process flow 200 shown in FIG. 16. In accordance with some embodiments of the present disclosure, conductive feature 64 includes barrier layer 60 and conductive region 62 over barrier layer 60. Conductive barrier layer 60 may be formed of titanium, titanium nitride, tantalum, tantalum nitride, Co, or the like. Conductive region 62 may be formed of metals such as copper, aluminum, tungsten, cobalt, or the like, or the alloys of these metals. SOT MRAM cell 54 includes three terminals 70, 72, and 74, which are connected to current sources (not shown) or voltage sources (not shown) in the respectively die during writing and reading operations.

The SOT MRAM cell 54 may be placed in a plurality of locations in a device die, and may a part of a SOT MRAM array. In accordance with some embodiments of the present disclosure, the device die may include transistors (as selectors) formed at a surface of a semiconductor substrate. A plurality of dielectric layers such as inter-layer dielectric (ILD, in which contact plugs are formed), Inter-Metal Dielectric (IMD, in which metal lines and vias are formed), passivation layers, and the like are formed over the selector transistors. The ILD and IMDs may be low-k dielectric layers or non-low-k dielectric layers. The SOT MRAM cell 54 may be formed in one of the ILD or IMD layers. In accordance with some embodiments, the SOT MRAM cell 54 is formed in one of the IMD layers such as the same IMD layer as M3, M2, M1, or the like. One of the terminals 70 and 72 such as terminal 70 (FIG. 10) may be electrically connected to a source/drain region of a first selector transistor, and the gate of the first selector transistor may be connected to a read word line of the respective SOT MRAM array. The other terminal (such as 72) of the SOT MRAM cell 54 may be connected to a write word line of the SOT MRAM array. The terminal 74 (FIG. 10) may be electrically connected to a source/drain region of a second selector transistor, and the gate of the second selector transistor may be connected to a write word line of the respective SOT MRAM array.

The SOT MRAM cell 54 as formed using the aforementioned processes may be a perpendicular MRAM cell or an in-plane MRAM cell. For example, FIG. 10 illustrates the example spin polarization directions of a perpendicular MRAM cell 54 in accordance with some embodiments, with the spin polarization directions of free layer 26', reference layer 30', and hard layer 34' being in the +Z or −Z directions. In the illustrated example, the spin polarization directions of reference layer 30' and hard layer 34' are in the +Z direction and −Z direction, respectively, and are fixed. These directions may be inversed in accordance with other embodiments. The spin polarization direction of free layer 26' may be programmed as being in either +Z direction or −Z direction. If the spin polarization direction of free layer 26' is in the same direction as the spin polarization direction of reference layer 30', the SOT MRAM cell 54 is at a low-resistance state. Conversely, if the spin polarization direction of free layer 26' is opposite to the spin polarization direction of reference layer 30', the SOT MRAM cell 54 is at a high-resistance state. The polarization of anti-ferromagnetic layer 36' is in +Z and −Z directions, which is used to generate a stray field and result in anti-ferromagnetic (Ruderman-Kittel-Kasuya-Yosida) RKKY coupling to the underlying hard layer 34'.

FIG. 11 illustrates the spin polarization directions of an in-plane SOT MRAM cell 54 in accordance with some embodiments, with the spin polarization directions of free layer 26', reference layer 30', and hard layer 34' being in the +X or −X directions. In the illustrated example, the spin polarization directions of reference layer 30' and hard layer 34' are in the −X direction and +X direction, respectively, and are fixed. These directions may be inversed in accordance with other embodiments. The spin polarization direction of free layer 26' may be programmed as being in either +X direction or −X direction. If the spin polarization direction of free layer 26' is parallel (in the same direction) to the spin polarization direction of reference layer 30', the SOT MRAM cell 54 is at a low-resistance state. Conversely, if the spin polarization direction of free layer 26' is anti-parallel (in opposite directions) to the spin polarization direction of reference layer 30', the SOT MRAM cell 54 is at a high-resistance state. The spin polarization of anti-ferromagnetic layer 36' is in +X and −X directions.

The SOT MRAM cells 54 as shown in FIGS. 10 and 11 are formed using essentially the same process, which are discussed referring to FIGS. 1 through 10 as examples. By selecting appropriate thickness T3 (FIG. 1) for free layer 26', the spin polarization directions may be set as what are shown in FIG. 10 or FIG. 11. For example, when thickness T3 is smaller than about 1.2 nm, the spin polarization directions are set as what are shown in FIG. 10, and the resulting SOT MRAM cell 54 is a perpendicular SOT MRAM cell. Conversely, when thickness T3 is greater than about 1.2 nm, the spin polarization directions are set as what are shown in FIG. 11, and the resulting SOT MRAM cell 54 is an in-plane SOT MRAM cell.

Figure 12:
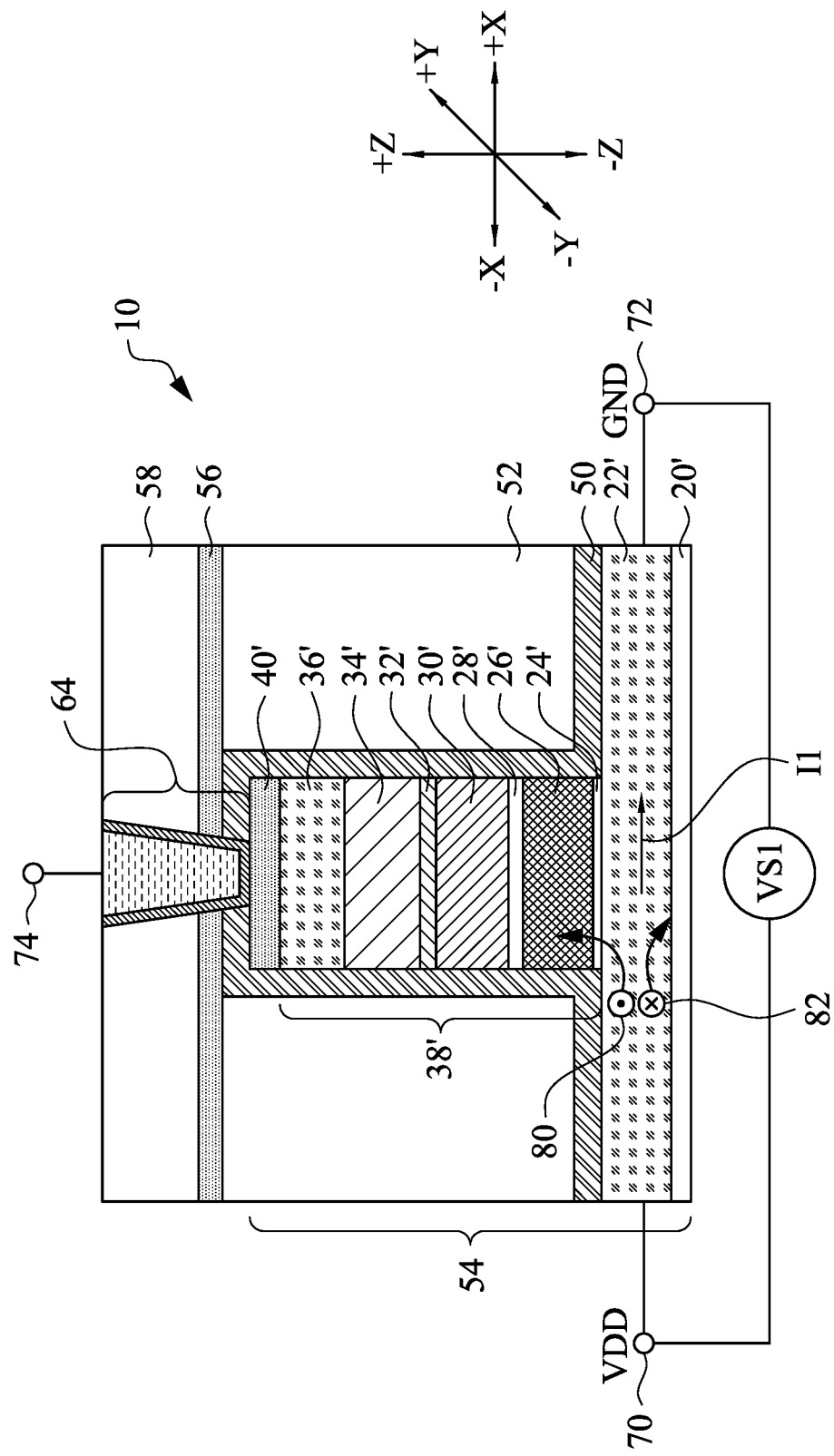
FIG. 12 illustrates the writing (programming) operation of an SOT MRAM cell in accordance with some embodiments.

FIG. 12 illustrates an example writing operation in accordance with some embodiments. To write SOT MRAM cell 54, a programming current I1 is applied, which may be achieved by connecting voltage source VS1 (or a current source) between terminals 70 and 72. For example, terminals 70 and 72 may be connected to positive power supply voltage VDD and electrical ground GND, respectively. Terminal 74 may be disconnected from any voltage source and any current source. With the programming current I1 flowing through spin orbit coupling layer 22', spin orbit coupling layer 22' generates spin polarized currents, with some spin polarized current having the spin polarization direction being out of the illustrated plane (represented by dot 80), and other spin polarized current having the spin polarization direction being into the illustrated plane (represented by the "x" sign 82). The spin polarized current (carriers) having the spin polarization direction 80 flow upwardly, penetrate through dielectric interfacial layer 24', and flow into free layer 26'. In Free layer 26, the spin polarized current (carriers) transfer their spin to free layer 26', and hence free layer 26' is programmed. The spin polarized current having the spin polarization direction 82 then flow downwardly, and are accumulated at the interface between spin orbit coupling layer 22' and the underlying seed layer 20'. The spin polarized current having the spin polarization direction 80, after flowing into free layer 26' (with the spin transferred to free layer 26') will flow in the right direction and then downwardly back into spin orbit coupling layer 22', and flow to terminal 72. During the programming operation, an external magnetic field (not shown) is applied, and the resulting spin polarization direction of free layer 26' depends on the external magnetic field and the direction of current I1. After the programming operation is performed, SOT MRAM cell 54 is at a high-resistance state or a low-resistance state as intended. If SOT MRAM cell 54 is to be programmed to a different state than the example shown in FIG. 12, the flowing direction of programming current I1 may be inversed from the illustrated direction, or the external magnetic field may be inversed.

A conventional SOT MRAM cell has a spin orbit coupling layer directly contacting the corresponding free layer. In the embodiments of the present disclosure, due to the existence of dielectric interfacial layer 24', the spin polarized current of the SOT MRAM cell 54 is increased over the spin polarized current of the conventional SOT MRAM, even if both of the SOT MRAM cell 54 and the conventional SOT MRAM cell are programmed with the same programming current. Accordingly, the efficiency in the generation of spin polarized current from the programming current is improved. The improvement may be due to the increased scattering at the interface between the spin orbit coupling layer 22' and dielectric interfacial layer 24'.

Figure 13:
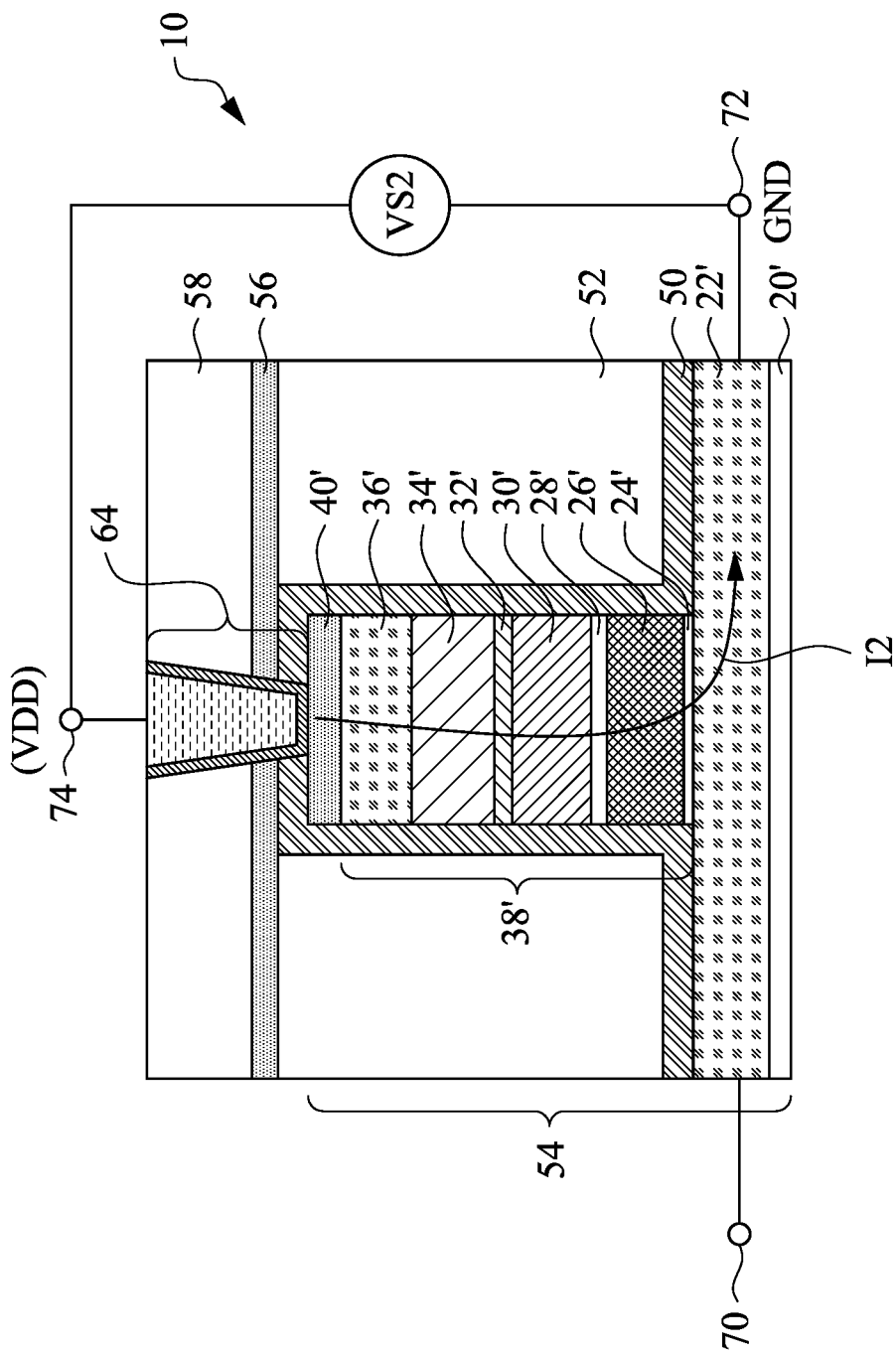
FIG. 13 illustrates the reading operation of an SOT MRAM cell in accordance with some embodiments.

FIG. 13 illustrates an example reading operation in accordance with some embodiments. To read SOT MRAM cell 54, a voltage is applied on terminal 74 and one of the terminals 70 and 72, for example, by voltage source VS2. For example, terminals 74 and 72 may be connected to positive power supply voltage VDD and electrical ground GND, respectively. The spin polarization direction of free layer 26' relative to reference layer 30' determines the resistance of SOT MRAM cell 54, and the resulting current I2 flowing through SOT MRAM cell 54 reflects the resistance of SOT MRAM cell 54. For example, when the spin polarization directions of free layer 26' and reference layer 30' are parallel (the same direction), SOT MRAM cell 54 is at a low-resistance state. Conversely, when the spin polarization directions of free layer 26' and reference layer 30' are anti-parallel (in opposite directions), SOT MRAM cell 54 is at a high-resistance state.

Figure 14:
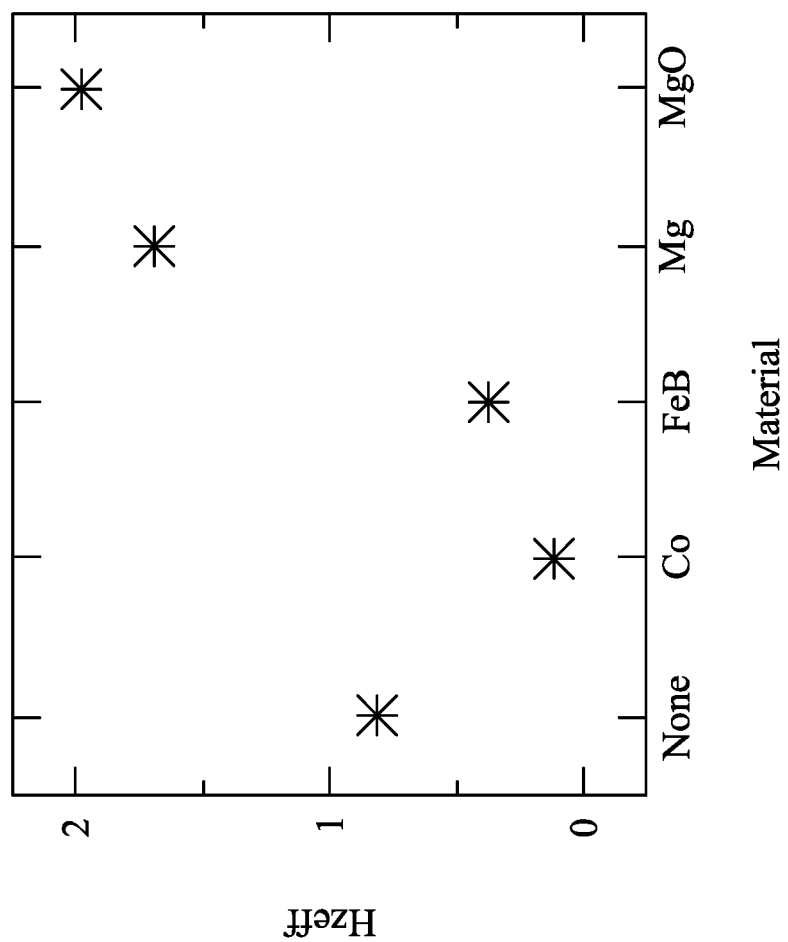
FIGS. 14 and 15 illustrate the comparison of the results of several SOT MRAM cells having different materials inserted between the corresponding spin orbit coupling layers and free layers in accordance with some embodiments.

FIG. 14 illustrates some experiment results, wherein the current-induced effective field values ($H_{zeff}$) of several sample SOT MRAM cells are shown. The current-induced effective field values indicate how effective the spin polarization current can be generated by conducting a programming current into the spin orbit coupling layer. The Y axis represents the normalized current-induced effective field values $H_{zeff}$. The X axis represents five samples, in which at the position of dielectric interfacial layer 24' (FIG. 10 or 11), different materials may be use instead. The current-induced effective field values $H_{zeff}$ are estimated by measuring the in-plane coercivity He at different currents using these samples. The term "none" represents that no layer is formed between spin orbit coupling layer 22' and free layer 26'. The terms "Co," "FeB," "Mg," and "MgO" represent that a cobalt layer, a FeB layer, a Mg layer, or a MgO layer, respectively, are formed where dielectric interfacial layer 24' is located. The experimental results indicate that the current-induced effective field value of the sample SOT MRAM cell including the MgO layer is the highest among the five samples, indicating the effect of the dielectric interfacial layer 24' is better than all other samples.

Figure 15:
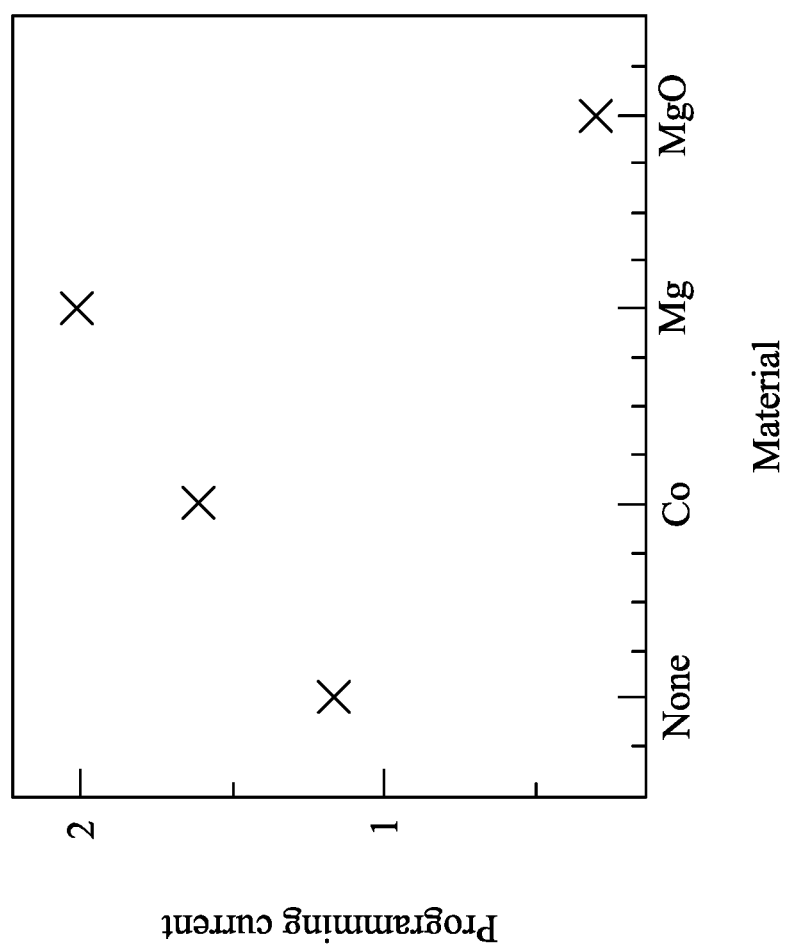

FIG. 15 illustrates the experiment results, wherein the required programming current for effectively programming SOT MRAM cell 54 (FIG. 10 or 11) of several sample SOT MRAM cells are measured. The Y axis represents the required programming current (normalized). The X axis represents four samples. Again, the term "none" represents that no layer is formed between spin orbit coupling layer 22' and free layer 26'. The terms "Co," "Mg," and "MgO" represent that a cobalt layer, a Mg layer, or a MgO layer, respectively, are formed where dielectric interfacial layer 24' is located. The experimental results indicate that the required current for programming the SOT MRAM cell having the MgO layer is the lowest, indicating the effect of the dielectric interfacial layer 24' is better than all other samples.

The embodiments of the present disclosure have some advantageous features. By forming a thin dielectric interfacial layer between the spin orbit coupling layer and the free layer, the spin polarized current generated from the current conducted through the spin orbit coupling layer is increased than if no dielectric interfacial layer is formed, and is increased than if a metallic interfacial layer is formed. The spin polarization direction of the free layer thus can be programmed with a smaller programming current than in conventional SOT MRAM cells. The efficiency of the programming is thus improved.

In accordance with some embodiments of the present disclosure, a method comprises depositing a plurality of layers, which comprises depositing a spin orbit coupling layer; depositing a dielectric layer over the spin orbit coupling layer; depositing a free layer over the dielectric layer; depositing a tunnel barrier layer over the free layer; and depositing a reference layer over the tunnel barrier layer; performing a first patterning process to pattern the plurality of layers; and performing a second patterning process to pattern the reference layer, the tunnel barrier layer, the free layer, and the dielectric layer, wherein the second patterning process stops on a top surface of the spin orbit coupling layer. In an embodiment, the spin orbit coupling layer is configured to generate spin polarized carriers, and the dielectric layer is configured to allow the spin polarized carriers to tunnel through. In an embodiment, the dielectric layer is deposited to a thickness smaller than about 10 Å. In an embodiment, the depositing the spin orbit coupling layer comprises physical vapor deposition. In an embodiment, the method further comprises forming a magnesium oxide seed layer underlying and contacting the spin orbit coupling layer. In an embodiment, the magnesium oxide seed layer is patterned in the first patterning process. In an embodiment, the method further comprises depositing a dielectric capping layer, wherein the dielectric capping layer contacts a sidewall of the dielectric layer. In an embodiment, the depositing the dielectric layer comprises depositing a nitride layer. In an embodiment, the depositing the dielectric layer comprises depositing an oxide layer.

In accordance with some embodiments of the present disclosure, a method comprises forming a metal layer; forming a MTJ over the metal layer, wherein the MTJ comprises a dielectric layer over the metal layer; a free layer over the dielectric layer, wherein the dielectric layer has a thickness configured to allow spin polarized carriers in the metal layer to flow through the dielectric layer into the free layer; a tunnel barrier layer over the free layer; and a reference layer over the tunnel barrier layer; and depositing a dielectric capping layer on sidewalls of the MTJ, wherein the dielectric capping layer contacts edges of the dielectric layer, and extends on a top surface of the metal layer. In an embodiment, the forming the dielectric layer is performed through atomic layer deposition. In an embodiment, the forming the dielectric layer comprises depositing a material selected from the group consisting of MgO, $HfO_x$, $AlO_x$, $AgO_x$, CuO, SrO, HfN, AlN, AgN, SrN, and combinations thereof. In an embodiment, the free layer has an in-plane spin polarization direction. In an embodiment, the free layer has a perpendicular spin polarization direction.

In accordance with some embodiments of the present disclosure, a device comprises a spin orbit coupling layer and a MTJ stack, and a dielectric layer over the spin orbit coupling layer. The MTJ stack comprises a free layer over the dielectric layer; a tunnel barrier layer over the free layer; and a reference layer over the tunnel barrier layer. The spin orbit coupling layer extends beyond edges of the MTJ stack in a first direction and a second direction opposite to the first direction. In an embodiment, the dielectric layer comprises a nitride or an oxide. In an embodiment, the free layer and the reference layer are formed of ferromagnetic materials. In an embodiment, the dielectric layer has a thickness allowing spin polarized carriers in the spin orbit coupling layer to tunnel through and flow into the free layer. In an embodiment, the spin orbit coupling layer laterally extends beyond edges of the MTJ stack in a third direction perpendicular to the first direction and the second direction. In an embodiment, the spin orbit coupling layer has a first edge flush with a second edge of the MTJ stack.

In accordance with some embodiments of the present disclosure, a method comprises programming an SOT MRAM cell, wherein the SOT MRAM cell comprises a spin orbit coupling layer; a dielectric layer over the spin orbit coupling layer; and a free layer over the dielectric layer, wherein the programming comprises applying a current to flow through the spin orbit coupling layer to program a polarization direction of the free layer. In an embodiment, the SOT MRAM cell further comprises a SAF layer over the free layer, wherein the SAF layer has a first spin polarization direction, and a second spin polarization direction of the free layer is programmed as being parallel to or anti-parallel to the first spin polarization direction. In an embodiment, the method further comprises applying a voltage to generate a current flowing through the free layer, the dielectric layer, and the spin orbit coupling layer; and measuring the current to determine a high-resistance state or a low-resistance state of the SOT MRAM. In an embodiment, the current further flows through an anti-ferromagnetic layer over an SAF layer over the free layer. In an embodiment, during the programming, spin polarized carriers in the spin orbit coupling layer tunnel through the dielectric layer to flow into the free layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a dielectric seed layer having a crystalline structure;
   a spin orbit coupling layer over the dielectric seed layer; and
   a Magnetic Tunnel Junction (MTJ) stack comprising:
      a dielectric layer over the spin orbit coupling layer;
      a free layer over the dielectric layer;
      a tunnel barrier layer over the free layer; and
      a reference layer over the tunnel barrier layer, wherein the spin orbit coupling layer extends beyond edges of the MTJ stack in a first direction and a second direction opposite to the first direction.

2. The device of claim 1, wherein the dielectric layer comprises a nitride or an oxide.

3. The device of claim 1, wherein the free layer and the reference layer are formed of ferromagnetic materials.

4. The device of claim 1, wherein the dielectric layer has a thickness allowing spin polarized carriers in the spin orbit coupling layer to tunnel through and flowing into the free layer.

5. The device of claim 1, wherein the spin orbit coupling layer further extends laterally beyond edges of the MTJ stack in a third direction perpendicular to the first direction and the second direction.

6. The device of claim 1, wherein the spin orbit coupling layer extends laterally beyond an edge of the MTJ stack.

7. The device of claim 1, wherein the dielectric seed layer and the spin orbit coupling layer have edges vertically aligned to each other.

8. The device of claim 7, wherein the dielectric seed layer comprises magnesium oxide.

9. A device comprising:
a dielectric seed layer having a crystalline structure;
a metal layer over and contacting the dielectric seed layer;
a Magnetic Tunnel Junction (MTJ) over the metal layer, wherein the MTJ comprises:
a dielectric layer over the metal layer;
a free layer over the dielectric layer, wherein the dielectric layer has a thickness configured to allow spin polarized carriers in the metal layer to flow through the dielectric layer into the free layer;
a tunnel barrier layer over the free layer; and
a reference layer over the tunnel barrier layer; and
a dielectric capping layer on sidewalls of the MTJ, wherein the dielectric capping layer contacts edges of the dielectric layer, and extends on a top surface of the metal layer.

10. The device of claim 9, wherein the dielectric seed layer comprises a material selected from the group consisting of MgO, HfOx, AlOx, AgOx, CuO, SrO, HfN, AlN, AgN, SrN, and combinations thereof.

11. The device of claim 10, wherein the dielectric seed layer comprises magnesium oxide.

12. The device of claim 10, wherein edges of the dielectric seed layer are vertically aligned to respective edges of the metal layer.

13. The device of claim 9, wherein the free layer has an in-plane spin polarization direction.

14. The device of claim 9, wherein the free layer has a perpendicular spin polarization direction.

15. The device of claim 9, wherein the metal layer is selected from the group consisting of W, Ta, Pt, AuPt, $W_3Ta$, $Bi_xSe_y$, BiSeTe, and combinations thereof.

16. A device comprising:
a first dielectric layer having a crystalline structure;
a metal layer over and contacting the first dielectric layer, wherein first edges of the first dielectric layer are vertically aligned to respective second edges of the metal layer;
a second dielectric layer over the metal layer, wherein the second dielectric layer has a thickness thin enough to allow spin polarized carriers to flow through;
a free layer over the second dielectric layer;
a tunnel barrier layer over the free layer; and
a reference layer over the tunnel barrier layer.

17. The device of claim 16, wherein the second dielectric layer is thin enough to allow electrons to tunnel through.

18. The device of claim 16, wherein the first dielectric layer comprises MgO.

19. The device of claim 18, and wherein the first dielectric layer and the metal layer extend laterally beyond the free layer.

20. The device of claim 16, wherein the free layer comprises a ferromagnetic material.

* * * * *